United States Patent
Li et al.

(10) Patent No.: US 7,715,266 B2
(45) Date of Patent: May 11, 2010

(54) MEMORY DETECTING CIRCUIT

(75) Inventors: Bing-Jian Li, Shenzhen (CN); Ning Wang, Shenzhen (CN); Yong-Xing You, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 72 days.

(21) Appl. No.: 12/202,335

(22) Filed: Sep. 1, 2008

(65) Prior Publication Data

US 2010/0027307 A1    Feb. 4, 2010

(30) Foreign Application Priority Data

Jul. 30, 2008    (CN) .................. 2008 1 0303229

(51) Int. Cl.
*G11C 7/00* (2006.01)
(52) U.S. Cl. .................. 365/226; 365/229; 365/230.06
(58) Field of Classification Search .................. 365/63, 365/226, 230.06, 229, 243, 175
See application file for complete search history.

(56) References Cited

U.S. PATENT DOCUMENTS

| 6,912,139 | B2 * | 6/2005 | Kernahan et al. | ............. | 363/41 |
| 6,954,103 | B2 * | 10/2005 | Yamauchi et al. | ........... | 327/540 |
| 7,095,220 | B2 * | 8/2006 | Kernahan | ................... | 323/300 |

* cited by examiner

*Primary Examiner*—Son Dinh
(74) *Attorney, Agent, or Firm*—Zhigang Ma

(57) ABSTRACT

A memory detecting circuit includes five switch elements and two indication devices. A first switch element is connected to a standby power, and also connected to memory sockets of a first channel to receive a first memory detecting signal. A second switch element is connected to the first switch element and the standby power. A third switch element is connected to the second switch element and the standby power, and also connected to memory sockets of a second channel to receive a second memory detecting signal. A fourth switch element is connected to the third switch element and the standby power. A fifth switch element is connected to the fourth switch element and the standby power. When there are memories installed into the memory sockets of the first channel and the second channel, the second indication device indicates that the memories run in a dual channel mode.

10 Claims, 1 Drawing Sheet

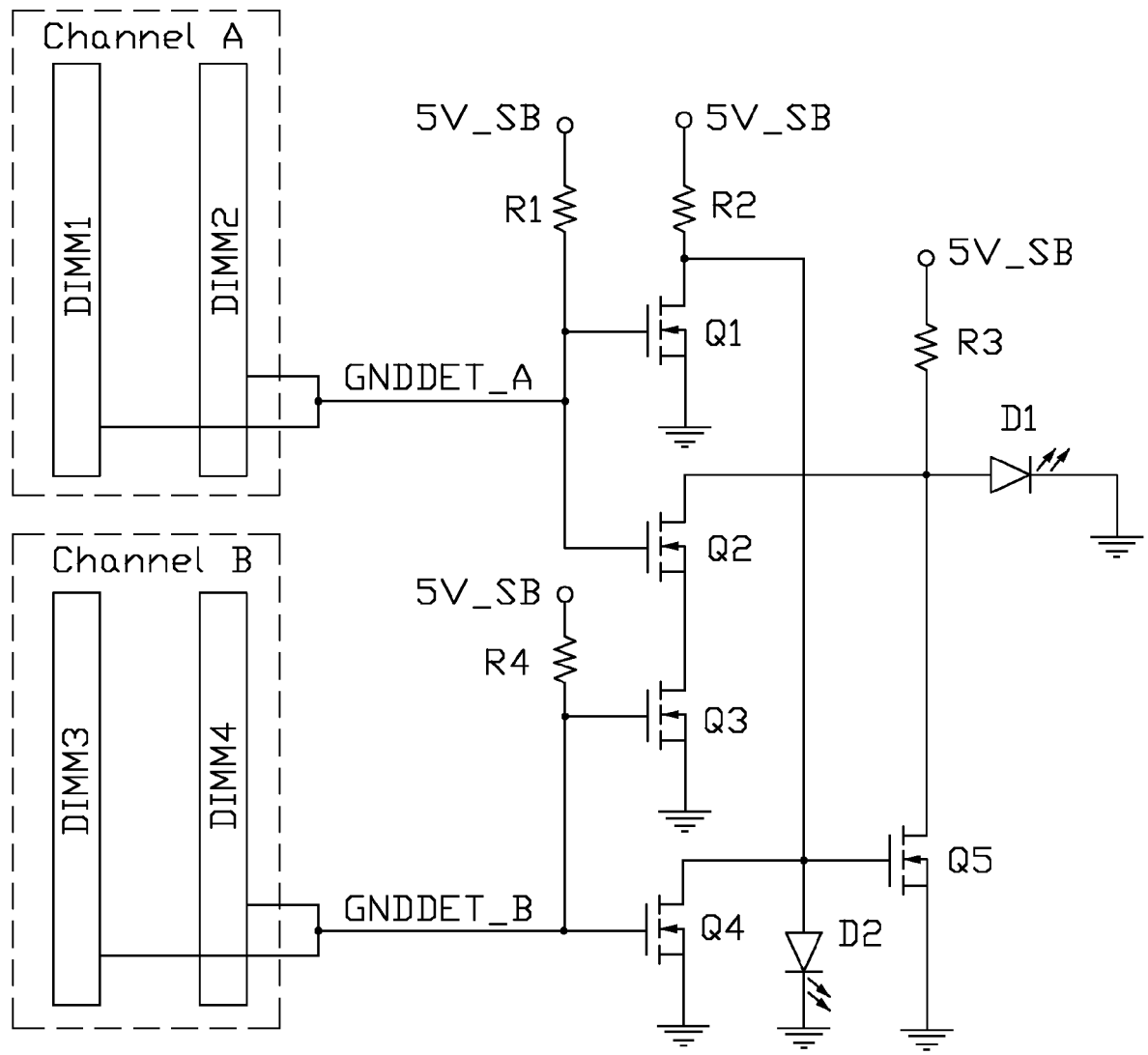

MEMORY DETECTING CIRCUIT

BACKGROUND

1. Field of the Invention

The present invention relates to detecting circuits and, particularly, to a memory detecting circuit for a motherboard.

2. Description of the Related Art

In a computer system, a central processing unit (CPU) reads data faster than a random access memory (RAM) can deliver, and usually the CPU has to wait for the RAM to deliver data. When the RAM is unable to keep up with the CPU, however, a bottleneck occurs, leaving the CPU with nothing to process. Under a single channel mode, any CPU with a bus speed greater than the RAM speed would be susceptible to the bottleneck effect. A dual channel mode is a technique used to alleviate the problem by doubling the amount of the available memory bandwidth. Instead of the single channel mode, a second parallel channel is added in the dual channel mode. With two channels working simultaneously, the bottleneck effect is reduced. Rather than waiting for the memory technology to improve, the dual channel mode simply takes the existing memory technology and modifies the method in which it is handled. With two channels working simultaneously, more information can be retrieved from the memory in the same amount of time, and thus improving the computer system performance.

In order to achieve this, two or more memories must be installed into matching memory sockets. The memory sockets belonging to different channel are usually color coded on the motherboard. The dual channel mode should be achieved with the matching memories installed in each channel. However, the users are usually unclear about which memory sockets belong to the same channel, this is because not all memory sockets are color coded by the motherboard manufacturers. The memory configurations that do not match a dual channel conditions will revert to the single channel mode. It usually costs much time to arrange the memories to achieve the dual channel mode, for that it needs to reboot the compute to check the memory configuration information via a basic input output system (BIOS) main menu. At booting time, the memory configuration is detected and the alert message about the memories rearranged running in the dual channel mode or the single channel mode can be obtained.

What is needed, therefore, is a memory detecting circuit which can overcome the above problems.

BRIEF DESCRIPTION OF THE DRAWING

The drawing is a circuit diagram of an embodiment of a memory detecting circuit for a motherboard in accordance with an embodiment of the present invention.

DETAILED DESCRIPTION

Referring to the drawing, a memory detecting circuit for a motherboard in accordance with an embodiment of the present invention includes five N type metal oxide semiconductor (NMOS) transistors Q1~Q5, four resistors R1~R4, and two light emitting diodes D1 and D2.

The gate of the NMOS transistor Q1 is arranged to receive a standby power 5V_SB provided by the motherboard via the resistor R1, and also connected to ground lines of two memory sockets DIMM1 and DIMM2 to receive a first memory detecting signal GNDDET_A. The drain of the NMOS transistor Q1 is arranged to receive the standby power 5V_SB via the resistor R2. The source of the NMOS transistor Q1 is grounded. The gates of the NMOS transistors Q1 and Q2 are connected to each other. The drain of the NMOS transistor Q2 is arranged to receive the standby power 5V_SB via the resistor R3, and also connected to the anode of the light emitting diode D1. The source of the NMOS transistor Q2 is connected to the drain of the NMOS transistor Q3. The gate of the NMOS transistor Q3 is arranged to receive a standby power 5V_SB via the resistor R4, and also connected to ground lines of two memory sockets DIMM3 and DIMM4 to receive a second memory detecting signal GNDDET_B. The source of the NMOS transistor Q3 is grounded. The gates of the NMOS transistors Q3 and Q4 are connected to each other. The drain of the NMOS transistor Q4 is connected to the gate of the NMOS transistor Q5 and the anode of the light emitting diode D2. The source of the NMOS transistor Q4 is grounded. The gate of the NMOS transistor Q5 is connected to the drain of the NMOS transistor Q1. The drains of the NMOS transistors Q5 and Q2 are connected to each other. The source of the NMOS transistor Q5 is grounded. The cathodes of the light emitting diodes D1 and D2 are both grounded.

In the present embodiment, the memory sockets DIMM1 and DIMM2 are assumed to belong to a first channel A, and the memory sockets DIMM3 and DIMM4 are assumed to belong to a second channel B. The first memory detecting signal GNDDET_A is used to indicate whether the channel A is installed with memories or not. The second memory detecting signal GNDDET_B is used to indicate whether the channel B is installed with memories or not. When any of the memory sockets of the channel A or channel B is installed with a memory. For example, if the memory socket DIMM1 is installed with a memory, the ground line of the memory socket DIMM1 becomes grounded, thereby the corresponding memory detecting signal GNDDET_A is at a low voltage level. When there is no memory installed into any memory socket of the channel A and channel B, the corresponding memory detecting signal GNDDET_A and GNDDET_B are both at a high voltage level.

The present embodiment describes an instance when there are two memories on the motherboard. When there is only one memory on the motherboard, the memory runs in a single channel mode. When there are three or four memories on the motherboard, the memories works as the instance when there are two memories on the motherboard.

When the two memories are installed into the memory sockets DIMM1 and respectively, the first memory detecting signal GNDDET_A is at a low voltage level, and the second memory detecting signal GNDDET_B is at a high voltage level. Therefore, the NMOS transistors Q1 and Q2 are turned off, the NMOS transistor Q3 and Q4 are turned on, and the NMOS transistor Q5 is turned off. The standby power 5V_SB powers the light emitting diode D1 to light up, indicating that the memories run in the single channel mode.

When the memory sockets DIMM3 and DIMM4 are installed with memories correspondingly, the first memory detecting signal GNDDET_A is at a high voltage level, and the second memory detecting signal GNDDET_B is at a low voltage level. Therefore, the NMOS transistors Q1 and Q2 are turned on, the NMOS transistor Q3 and Q4 are turned off, and the NMOS transistor Q5 is turned off. The standby power 5V_SB powers the light emitting diode D1 to light up, indicating that the memories are running in the single channel mode.

When one of the two memories is installed into the memory socket DIMM1 or DIMM2, and the other memory is installed into the memory socket DIMM3 or DIMM4, the first memory detecting signal GNDDET_A and the second memory detecting signal GNDDET_B are both at a low voltage level. Therefore, the NMOS transistors Q1, Q2, Q3 and Q4 are turned off, and the NMOS transistor Q5 is turned on. The standby power 5V_SB powers the light emitting diode D2 to light up, indicating that the memories are running in a dual channel mode.

When there is no memory installed into the memory sockets DIMM1, DIMM2 DIMM3 and DIMM4, the first memory detecting signal GNDDET_A and the second memory detecting signal GNDDET_B are both at a high voltage level. Therefore, the NMOS transistors Q1, Q2, Q3 and Q4 are turned on, and the NMOS transistor Q5 is turned off. The light emitting diodes D1 and D2 both emit no light, indicating that there is no memory on the motherboard.

The memory detecting circuit of the present invention can be mounted in the motherboard. The light emitting diodes D1 and D2 can be mounted to a computer enclosure. When the computer is powered, even though it is not turned on, the memory detecting circuit of the present invention is capable of indicating whether the memories are running in the single channel mode or the dual channel mode by drawing power from the standby power 5V_SB. Thereby the dual channel mode can be achieved quickly.

In another embodiment, the NMOS transistors Q1~Q5, functioning as switch elements, can be replaced by other kinds of transistors selectively, such as NPN transistors and the like. The light emitting diodes D1 and D2 can be replaced by other kinds of indication devices, such as buzzers and the like, which is well known to those skilled in the art.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A memory detecting circuit, comprising:
    a first switch element comprising:
        a first end arranged to receive a standby power, and also connected to memory sockets of a first channel to receive a first memory detecting signal;
        a second end arranged to receive the standby power; and
        a third end grounded;
    a second switch element comprising:
        a first end connected to the first end of the first switch element;
        a second end connected to the standby power; and
        a third end;
    a third switch element comprising:
        a first end arranged to receive the standby power, and also connected to memory sockets of a second channel to receive a second memory detecting signal;
        a second end connected to the third end of the second switch element; and
        a third end grounded;
    a fourth switch element comprising:
        a first end connected to the first end of the third switch element;
        a second end connected to the second end of the first switch element; and
        a third end grounded;
    a fifth switch element comprising:
        a first end connected to the second end of the fourth switch element;
        a second end connected to the second end of the second switch element; and
        a third end grounded;
    a first indication device connected to the second end of the second switch element; and
    a second indication device connected to the second end of the fourth switch element;
    wherein upon the condition that memories are only installed into the memory sockets of the first channel, the first memory detecting signal is at a low voltage level, and the second memory detecting signal is at a high voltage level, thereby the first switch element and the second switch element are turned off, the third switch element and the fourth switch element are turned on, and the fifth switch element is turned off, so that the first indication device indicates the memories run in a single channel mode;
    wherein upon the condition that the memories are only installed into the memory sockets of the second channel, the first memory detecting signal is at a high voltage level, and the second memory detecting signal is at a low voltage level, thereby the first switch element and the second switch element are turned on, the third switch element and the fourth switch element are turned off, and the fifth switch element is turned off, so that the first indication device indicates the memories run in the single channel mode; and
    wherein upon the condition that the memories are installed into the memory sockets of the first and the second channels respectively, the first and second memory detecting signals are both at a low voltage level, thereby the first switch element, the second switch element, the third switch element and the fourth switch element are turned off, and the fifth switch element are turned on, so that the second indication device indicates the memories run in a dual channel mode.

2. The memory detecting circuit as claimed in claim 1, wherein the first to fifth switch elements are five N type metal oxide semiconductor (NMOS) transistors, and the first ends, the second ends and the third ends of those serve as the gates, the drains and the sources respectively.

3. The memory detecting circuit as claimed in claim 1, wherein the first end of the first switch element is connected to the standby power via a resistor.

4. The memory detecting circuit as claimed in claim 1, wherein the second end of the first switch element is connected to the standby power via a resistor.

5. The memory detecting circuit as claimed in claim 1, wherein the second end of the second switch element is connected to the standby power via a resistor.

6. The memory detecting circuit as claimed in claim 1, wherein the first end of the third switch element is connected to the standby power via a resistor.

7. The memory detecting circuit as claimed in claim 1, wherein the first indication device is a first light emitting diode, and the second indication device is a second light emitting diode, the anode of the first light emitting diode is connected to the second end of the second switch element, and the cathode of the first light emitting diode is grounded; the anode of the second light emitting diode is connected to the second end of the fourth switch element, and the cathode of the second light emitting diode is grounded; wherein when the memories run in the single channel mode, the first light emitting diode is lit up; wherein when the memories run in the dual channel mode, the second light emitting diode is lit up.

8. The memory detecting circuit as claimed in claim 1, wherein the first indication device and the second indication device are mounted to a computer enclosure.

9. The memory detecting circuit as claimed in claim 1, wherein the first end of the first switch element is connected to a ground line of the memory sockets of the first channel, and the first end of the third switch element is connected to a ground line of the memory sockets of the second channel.

10. The memory detecting circuit as claimed in claim 1, wherein each of the first channel and the second channel includes at least one memory socket.

* * * * *